United States Patent [19]
Kunitou

[11] Patent Number: 5,470,774
[45] Date of Patent: Nov. 28, 1995

[54] FABRICATION METHOD OF A READ-ONLY SEMICONDUCTOR MEMORY DEVICE

[75] Inventor: Masao Kunitou, Tokyo, Japan

[73] Assignee: NEC Corporation, Tokyo, Japan

[21] Appl. No.: 319,099

[22] Filed: Oct. 6, 1994

[30] Foreign Application Priority Data

Oct. 8, 1993 [JP] Japan ................... 5-277883

[51] Int. Cl.$^6$ ............................... H01L 21/265
[52] U.S. Cl. ............... 437/45; 437/48; 437/52; 437/47
[58] Field of Search ............... 437/45, 48, 50, 437/52, 47, 60; 257/390–392

[56] References Cited

U.S. PATENT DOCUMENTS

| | | | |
|---|---|---|---|
| 5,063,170 | 11/1991 | Okuyama | 437/41 |
| 5,200,355 | 4/1993 | Choi et al. | 437/52 |
| 5,275,959 | 1/1994 | Kobayashi et al. | 437/29 |

FOREIGN PATENT DOCUMENTS 59-121877  7/1984  Japan .

Primary Examiner—Olik Chaudhuri
Assistant Examiner—H. Jey Tsai
Attorney, Agent, or Firm—Young & Thompson

[57] ABSTRACT

A fabrication method of a semiconductor memory device in which the punch-through phenomenon is difficult to occur in uncoded or unwritten memory cells. First impurity-doped regions for coding are formed in channel areas of selected ones of first MOS transistors in the memory cell area, using a patterned photoresist film as a mask, respectively. Second impurity-doped regions for threshold adjustment are formed in channel areas of unselected ones of the first transistors and second transistors in the peripheral circuit area, using a patterned photoresist film as a mask, respectively. During the process of forming the second impurity-doped regions, the dopant doped for threshold adjustment through the selected ones of the first transistors into the substrate forms third impurity-doped regions apart from the channel areas of the selected ones of the first transistors, respectively. The third impurity-doped regions serve to restrain the first dopant doped into the selected ones of the first transistors from laterally diffusing in the substrate, preventing the punch-through phenomenon.

16 Claims, 7 Drawing Sheets

FABRICATION METHOD OF A READ-ONLY SEMICONDUCTOR MEMORY DEVICE

BACKGROUND OF THE INVENTION

1. Field of the Invention

The present invention relates to a fabrication method of semiconductor memory device, and more particularly, to a fabrication method of a semiconductor memory device in which "punch-through" is prevented from occurring effectively.

2. Description of the Prior Art

Conventionally, with a semiconductor Read-Only Memory (ROM) device, a shorter Turn Around Time (TAT) tends to be required. To respond this requirement, it is preferably that a data-writing or coding process step is arranged as near the final process step of the fabrication sequence as possible.

For example, with a NAND-type semiconductor ROM device, a coding process step of doping impurity into channel areas of MOS transistors in specified memory cells is generally arranged after a process step of forming gate electrodes of the MOS transistors.

A conventional fabrication process sequence of the NAND-type semiconductor ROM device is described below referring to FIGS. 1A to 1E.

An n-type well 102 and a p-type well 103 are formed within a p-type silicon substrate 101. Then, a field oxide film 104 is selectively formed on the substrate 101 to define active regions. A silicon dioxide ($SiO_2$) film 116 is selectively formed on the active regions to protect the surfaces thereof.

Subsequently, as shown in FIG. 1A, a first photoresist film 106 is formed on the substrate 101 to cover the memory cell area P and the peripheral circuit are P of the substrate 101, and is patterned to have windows 106a. The windows 106a are placed at positions corresponding to the MOS transistors or memory cells to be doped with p-type impurity ions for threshold adjustment in the peripheral circuit area P, respectively.

Using the first photoresist film 106 thus patterned as a mask, boron (B) ions are selectively implanted into the active regions for the n-channel MOS transistors in the peripheral circuit area P at an acceleration energy of about 30 keV with a dose of about $2.0 \times 10^{12}$ ions/$cm^2$. Thus, p-type implantation regions 107 are formed in the p-type well 103, as shown in FIG. 1A. The first photoresist film 106 is then removed.

Similarly, as shown in FIG. 1B, a second photoresist film 108 is formed on the substrate 101 to cover the memory cell area P and the peripheral circuit are P of the substrate 101, and is patterned to have windows 108a. The windows 108a are placed at positions corresponding to the MOS transistors to be doped with p-type impurity ions for threshold adjustment in the peripheral circuit area P.

Using the second photoresist film 108 thus patterned as a mask, boron (B) ions are selectively implanted into the active regions for the p-channel MOS transistors in the peripheral circuit area P at an acceleration energy of about 30 keV with a dose of about $2.0 \times 10^{12}$ $cm^{-2}$. Thus, p-type implantation regions 109 are formed in the n-type well 102, as shown in FIG. 1B. The second photoresist film 108 is then removed.

Thus, the process steps for adjusting the threshold voltages of the MOS transistors in the peripheral circuit area P are finished.

Next, the substrate 101 thus ion-implanted is thermally oxidized so that a gate oxide film 105 is selectively formed on the respective active regions exposed by removing the silicon dioxide film 116, as shown in FIG. 1C.

A conductive film such as polysilicon film is then formed on the gate oxide film 105 and the field oxide film 104, and is patterned. Thus, gate electrodes 110 are formed over the p-type implantation layers 109 and 107 in the n- and p-type wells 102 and 103 in the peripheral circuit area P, respectively. Also, gate electrodes 110-1, 110-2, 110-3, 110-4 and 110-5 are formed at intervals over the p-type well 103 in the memory cell area C.

The gate electrodes 110, 110-1, 110-2, 110-3, 110-4 and 110-5 are about 0.3 μm in thickness.

To form n-type source/drain regions 111 in the p-type well 103, arsenic (As) ions as an n-type dopant are selectively implanted into the active regions for the n-channel MOS transistors in both the peripheral circuit area P and those in the memory cell area C at an acceleration energy of about 70 keV with a dose of about $3.0 \times 10^{15}$ ions/$cm^2$, respectively.

Thereafter, to form p-type source/drain region 112 in the n-type well 102, boron ions as a p-type dopant are selectively implanted into the active regions for the p-channel MOS transistors in the peripheral circuit area P at an acceleration energy of about 70 keV with a dose of about $5.0 \times 10^{15}$ ions/$cm^2$.

Thus, as shown in FIG. 1D, the n- and p-channel MOS transistors are obtained in the peripheral circuit area P. The n-channel MOS transistors are obtained in the memory cell area C.

The data-writing or coding process is carried out as follows:

As shown in FIG. 1D, a third photoresist film 113 is formed on the substrate 101 on the substrate 101 to cover the memory cell area P and the peripheral circuit are P, and is patterned to have windows 113a. The windows 113a are placed at positions corresponding to the n-channel MOS transistors or memory cells to be coded in the memory cell area C. Here, the windows 113a are positioned over the gate electrodes 110-1, 110-3 and 110-5, respectively.

Using the third photoresist film 113 thus patterned as a mask, phosphorus (P) ions as n-type dopant ions are selectively implanted into the active regions for the MOS transistors to be coded at an acceleration energy of about 360 keV with a dose of about $5.0 \times 10^{13}$ ions/$cm^2$. Thus, n-type implantation regions 114 for coding are formed in the p-type well 103, as shown in FIG. 1E.

Pairs of the n-type implantation regions 114 are formed in self align to the corresponding gate electrodes 110-1, 110-3 and 110-5, respectively. As shown in FIG. 1D, each pair of the regions 114 are communicated with each other under the corresponding gate electrodes 110-1, 110-3 and 110-5.

The third photoresist film 113 is then removed.

Subsequently, as shown in FIG. 1E, an interlayer insulator film 115 is formed to cover the memory cell area C and the peripheral circuit area P.

Then, the substrate 101 thus ion-implanted is subjected to heat-treatment. During this heat-treatment, the n-type dopant atoms doped into the n-type implantation regions 114 diffuse vertically and laterally in the p-type well 103.

As a result, as shown in FIG. 2, due to the punch-through phenomenon, the channel areas of the uncoded MOS transistors or memory cells corresponding to the gate electrodes 110-2 and 110-4 tend to communicate with each other, so that such the uncoded or unwritten memory cells easily become equivalent to the coded or written memory cells.

Thus, with the conventional fabrication method described above, there is a problem that the given, written data or program are easily read out in error since the uncoded memory cells easily become equivalent to the coded memory cells.

Also, since the p-type implantation regions 107 and 109 for threshold adjustment are formed using the different photoresist films 106 and 108, necessary fabrication process steps for this process increase. This is not preferable for such the memory device requiring a shorter TAT.

In addition, another conventional fabrication method of a semiconductor memory device of this sort is disclosed in the Japanese Patent Publication No. 59-121877. This method, however, relates to the memory device of the Metal-Insulator-Semiconductor (MIS) type.

SUMMARY OF THE INVENTION

Accordingly, an object of the present invention is to provide a fabrication method of a semiconductor memory device in which the punch-through phenomenon is difficult to occur in uncoded or unwritten memory cells, and as a result, the written data are read out in correct.

Another object of the present invention is to provide a fabrication method of a semiconductor memory device that enables a shorter Turn Around Time (TAT) of the semiconductor memory device than the conventional ones.

A fabrication method of a semiconductor memory device according to a first aspect of the present invention contains the following steps:

First, memory cells formed of first MOS transistors and peripheral circuits formed of second MOS transistors are prepared on a semiconductor substrate of a first conductivity type. The memory cells are formed in a memory cell area of the substrate, and the peripheral circuits are formed in a peripheral circuit area of the substrate. This step may be carried out by any of the transistor-forming processes.

Next, a photoresist film with windows is formed on the substrate to cover the memory cell area and the peripheral circuit area. Selected ones of the first transistors to be coded are exposed from the photoresist film through the windows, respectively.

A first dopant of a second conductivity type for coding are selectively doped into the selected ones of the first transistors using the patterned photoresist film as a mask. Thus, first impurity-doped regions of the second conductivity type are formed in channel areas of the selected ones of the first transistors, respectively.

A second dopant of the first conductivity type for threshold adjustment is doped into the first transistors and the second transistors through the same patterned photoresist film. Thus, second impurity-doped regions of the first conductivity type are formed in channel areas of unselected ones of the first transistors and the second transistors, respectively.

During the step of doping the second dopant for threshold adjustment, the second dopant doped through the selected ones of the first transistors forms third impurity-doped regions of the first conductivity type apart from the channel areas of the selected ones of the first transistors in the substrate, respectively.

The third impurity-doped regions serve to restrain the first dopant doped into the selected ones of the first transistors from laterally diffusing in the substrate.

Either of the step of selectively doping the first dopant for coding and the step of doping the second dopant for threshold adjustment may be carried out earlier. However, the step of doping the second dopant for threshold adjustment is preferably carried out after the step of selectively doping the first dopant for coding.

Preferably, the step of selectively doping the first dopant for coding and the step of doping the second dopant for threshold adjustment are carried out by ion-implantation, because doping depths of said first and second dopants can be controlled easily during these steps.

A fabrication method of a semiconductor memory device according to a second aspect of the present invention contains the following steps:

First, by the similar step of the first aspect, memory cells formed of first MOS transistors and peripheral circuits formed of second MOS transistors are prepared on a semiconductor substrate of a first conductivity type.

Next, an interlayer insulator film is formed on the substrate to cover the memory cell area and the peripheral circuit area of the substrate. The interlayer insulator film is then heated for reflowing.

A photoresist film with windows is formed on the substrate to cover the memory cell area and the peripheral circuit area. The windows are placed over selected ones of the first transistors to be coded, respectively.

Then, a first dopant of a second conductivity type for coding are selectively doped into the selected ones of the first transistors through the interlayer insulator film using the patterned photoresist film as a mask. Thus, first impurity-doped regions of the second conductivity type are formed in channel areas of the selected ones of the first transistors, respectively.

A second dopant of the first conductivity type for threshold adjustment are doped into the first transistors and the second transistors through the patterned photoresist film and the interlayer insulator film. Thus, second impurity-doped regions of the first conductivity type are formed in channel areas of unselected ones of the first transistors and the second transistors, respectively.

During the step of selectively doping the first dopant for coding, the second dopant doped through the selected ones of the first transistors forms third impurity-doped regions of the first conductivity type apart from the channel areas of the selected ones of the first transistors in the substrate, respectively.

The third impurity-doped regions serve to restrain the first dopant doped into the selected ones of the first transistors from laterally diffusing in the substrate.

Also in the method of the second aspect, either of the step of selectively doping the first dopant for coding and the step of doping the second dopant for threshold adjustment may be carried out earlier. However, the step of doping the second dopant for threshold adjustment is preferably carried out after the step of selectively doping the first dopant for coding.

Preferably, the step of selectively doping the first dopant for coding and the step of doping the second dopant for threshold adjustment are carried out by ion-implantation.

In the method of the second aspect, the following two steps may be added between the step of forming the interlayer insulator film and the step of heating the interlayer insulator film for reflowing.

In one of the additional steps, contact holes are formed in the interlayer insulator film. In another of the additional steps, contact regions are formed in the substrate at positions corresponding to the contact holes. The contact regions are electrically interconnected through the corresponding contact holes with a conductive film to be formed on the interlayer insulator film.

With the fabrication methods of the semiconductor memory device according to the first and second aspects of the invention, the step of forming the first impurity-doped regions for coding and the step of forming the second impurity-doped regions for threshold adjustment are carried out using the same patterned photoresist film as a mask.

Accordingly, the number of the process steps decreases compared with the conventional ones, enabling a shorter Turn Around Time (TAT) of the semiconductor memory device than the conventional ones.

Also, since the third impurity-doped regions serve to restrain the first dopant doped into the selected ones of the first transistors from laterally diffusing in the substrate, the adjacent channels of the uncoded MOS transistors or memory cells are prevented from communicating with each other.

As a result, the punch-through phenomenon is difficult or impossible to occur in the uncoded or unwritten memory cells, which means that the written data are read out in correct.

DETAILED DESCRIPTION OF THE PREFERRED EMBODIMENT

Figure 1A:
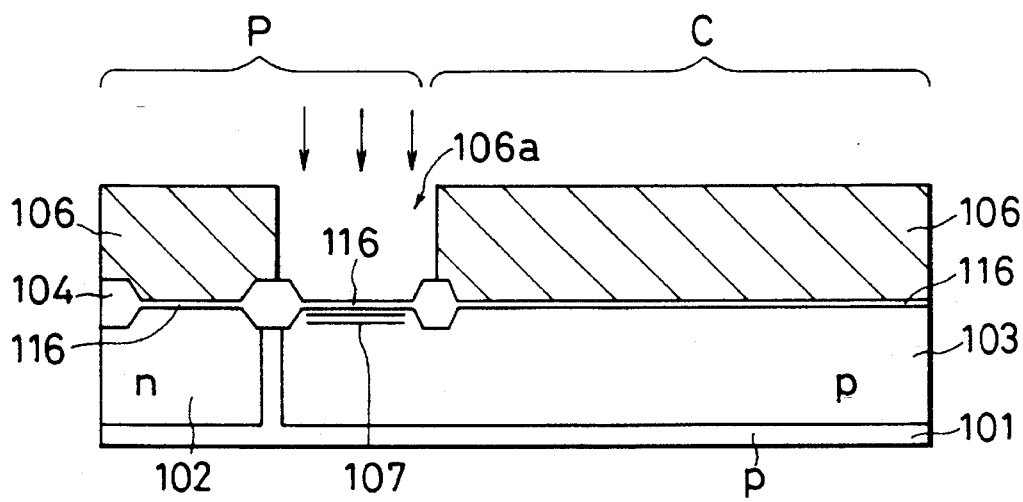
FIGS. 1A to 1E are partial cross-sections showing a conventional fabrication process steps of a semiconductor memory device, respectively.
Figure 1B:
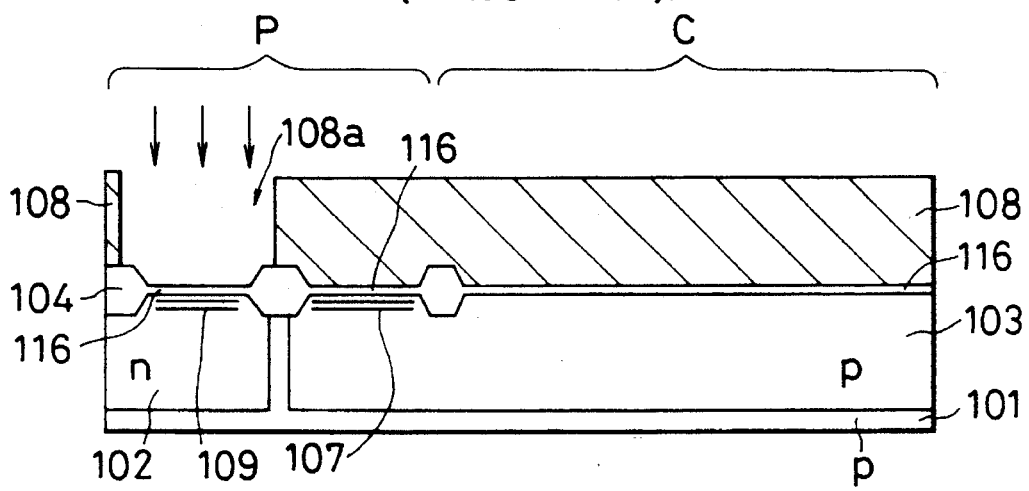
Figure 1C:
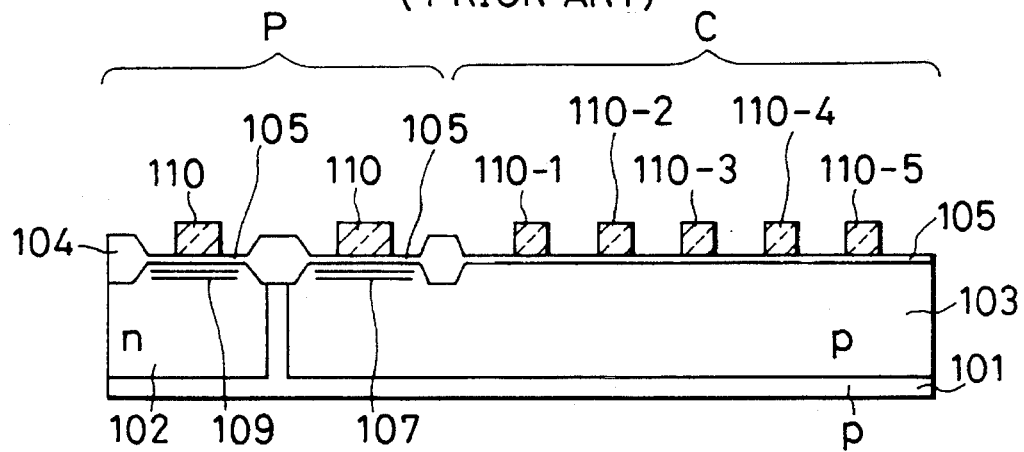

Preferred embodiments of the present invention will be described below referring to FIGS. 3A to 3D, FIGS. 4 and 5A and 5B attached.

FIRST EMBODIMENT

As a first embodiment of the present invention, a fabrication method of a NAND-type mask ROM device is described here.

The fabrication process sequence of the NAND-type semiconductor ROM device is described below referring to FIGS. 3A to 3D.

This mask ROM device has memory cells formed of MOS transistors and peripheral circuits formed of MOS transistors on a p-type semiconductor substrate 1. The memory cells are formed in a memory cell area C of the substrate 1, and the peripheral circuits are formed in a peripheral circuit area P of the substrate 1.

First, an n-type well 2 and a p-type well 3 are formed within the substrate 1. The n-type well 2 may be formed by ion-implantation of phosphorus at an acceleration energy of 100 to 200 keV with a dose of 1.0 to $2.0 \times 10^{13}$ ions/cm$^2$. The p-type well 3 may be formed by ion-implantation of boron at an acceleration energy of 100 to 200 keV with a dose of 2.0 to $3.0 \times 10^{13}$ ions/cm$^2$.

Then, a field oxide film 4 is selectively formed on the substrate 1 to define active regions for the respective MOS transistors by a Local Oxidation of Silicon (LOCOS) process. A silicon dioxide ($SiO_2$) film is selectively formed on the surfaces of the active regions thus defined to protect these surfaces.

Next, after removing the protection silicon dioxide film to expose the active regions, the substrate 1 is thermally oxidized so that a gate oxide film 5 is selectively formed on the respective active regions.

A conductive film such as polysilicon film is formed on the gate oxide film 5 and the field oxide film 4, and is patterned. Thus, gate electrodes 6 are formed on the gate oxide film 5 over the n- and p-type wells 2 and 3, respectively in the peripheral circuit area P. Gate electrodes 6-1, 6-2, 6-3, 6-4 and 6-5 are formed at intervals on the gate oxide film 5 over the p-type well 3 in the memory cell area C.

The gate electrodes 6, 6-1, 6-2, 6-3, 6-4 and 6-5 are about 0.3 μm in thickness.

Figure 3A:
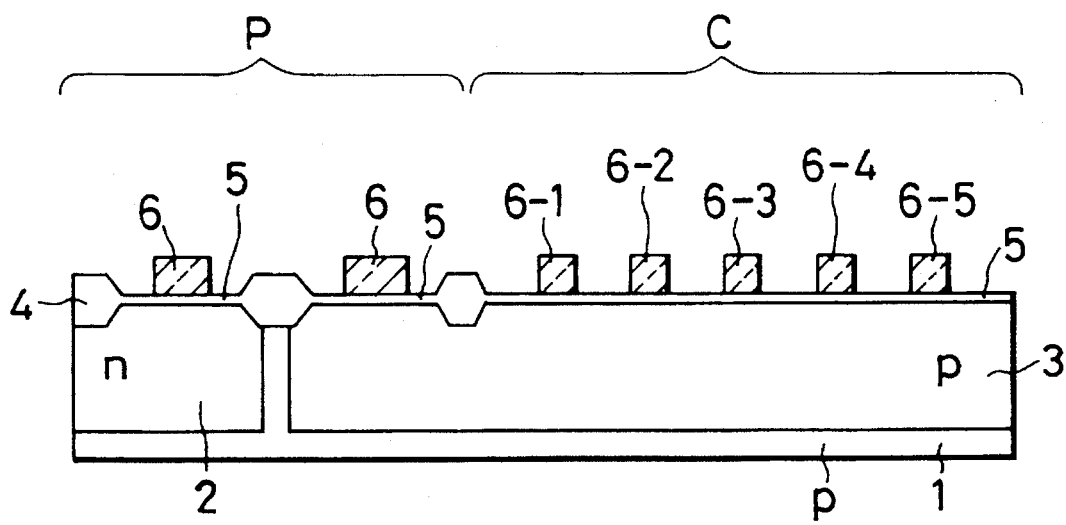
FIGS. 3A to 3D are partial cross-sections showing a fabrication method of a semiconductor memory device according to a first embodiment of the present invention, respectively.

The state of the substrate 1 at this time is shown in FIG. 3A.

Subsequently, to form n-type source/drain regions 7 in the p-type well 3, arsenic (As) ions are selectively implanted into the active regions for the n-channel MOS transistors both in the peripheral circuit area P and in the memory cell area C at an acceleration energy of about 70 keV with a dose of about $3.0 \times 10^{15}$ ions/cm$^2$, respectively. The n-type source/drain regions 7 are formed in self-align to the gate electrodes 6, 6-1, 6-2, 6-3, 6-4 and 6-5, respectively.

The source/drain regions 7 may be formed by ion-implantation of phosphorus at an acceleration energy of 70 to 100 keV with a dose of 2.0 to $3.0 \times 10^{15}$ ions/cm$^2$. The acceleration energy of 70 to 100 keV and the dose of 2.0 to $3.0 \times 10^{15}$ ions/cm$^2$ are selected to obtain a given depth such as about 0.05 μm of each source/drain region 7 and to obtain an ON-current $I_{ON}$ of 15 mA of each n-channel MOS transistor when the gate voltage $V_G$ and the drain voltage $V_D$ are 5 V.

Thereafter, to form p-type source/drain regions 8 in the n-type well 2, boron ions are selectively implanted into the active regions for the p-channel MOS transistors in the peripheral circuit area P at an acceleration energy of about 70 keV with a dose of about $5.0 \times 10^{15}$ ions/cm$^2$. The p-type source/drain regions 8 are formed in self-align to the gate electrodes 6, respectively.

The source/drain regions 8 may be formed by ion-implantation of boron at an acceleration energy of 70 to 100 keV with a dose of 5.0 to $6.0 \times 10^{15}$ ions/cm$^2$. The acceleration energy of 70 to 100 keV and the dose of 5.0 to $6.0 \times 10^{15}$ ions/cm$^2$ are selected to obtain a given depth such as about 0.2 μm of each source/drain region 8 and to obtain an ON-current $I_{ON}$ of 10 mA of each p-channel MOS transistor when the gate voltage $V_G$ and the drain voltage $V_D$ are −5 V.

Figure 3B:
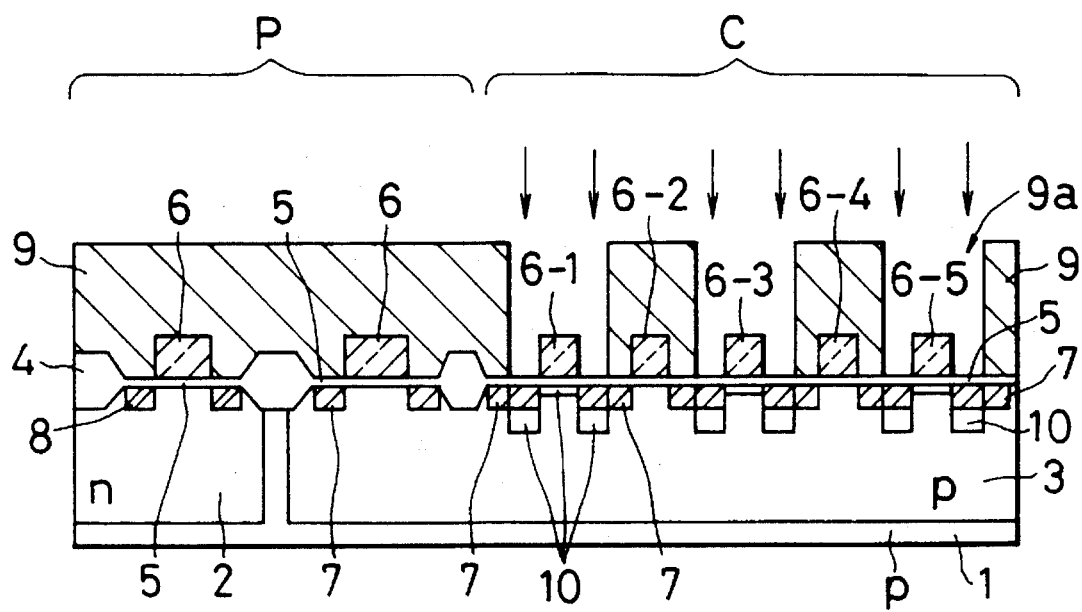

Thus, the n- and p-channel MOS transistors are obtained in the peripheral circuit area P, and the n-channel MOS transistors are obtained in the memory cell area C, as shown in FIG. 3B.

The data-writing or coding process steps for the substrate 1 with the MOS transistors thus obtained are as follows:

As shown in FIG. 3B, a photoresist film 9 is formed on the substrate 1 to cover the memory cell area C and the peripheral circuit area P, and is patterned to have windows 9a. The windows 9a are placed at positions corresponding to the MOS transistors to be coded in the memory cell area C by doping an n-type impurity into their channel areas.

Here, the windows 9a are positioned over the MOS transistors with the gate electrodes 6-1, 6-3 and 6-5, respectively.

Using the patterned photoresist film 9 as a mask, phosphorus (P) ions are selectively implanted into the active regions for the n-channel MOS transistors in the memory cell area C at an acceleration energy of about 360 keV with a dose of about $5.0 \times 10^{13}$ ions/cm$^2$. Thus, as shown in FIG. 3B, n-type implantation regions 10 are formed in the p-type well 3 in self-align to the gate electrodes 6-1, 6-3 and 6-5, respectively.

Pairs of the n-type implantation regions 10 are formed in self align to the corresponding gate electrodes 6-1, 6-3 and 6-5, respectively. As shown in FIG. 3B, each pair of the regions 10 are communicated with each other under the corresponding gate electrodes 6-1, 6-3 and 6-5. The regions 10 are provided deeper than the source/drain regions 7 in the substrate 1.

The n-type implantation regions 10 may be formed by ion-implantation of phosphorus at an acceleration energy of 300 to 400 keV with a dose of 1.0 to $5.0 \times 10^{13}$ ions/cm$^2$. The acceleration energy of 300 to 400 keV and the dose of 1.0 to $5.0 \times 10^{13}$ ions/cm$^2$ are selected so that the ions irradiated can pass through the gate electrodes 6-1, 6-3 and 6-5 and the gate oxide film 5 to form the corresponding implantation regions 10 under the respective gate electrodes 6-1, 6-3 and 6-5 with given depths.

Figure 1D:
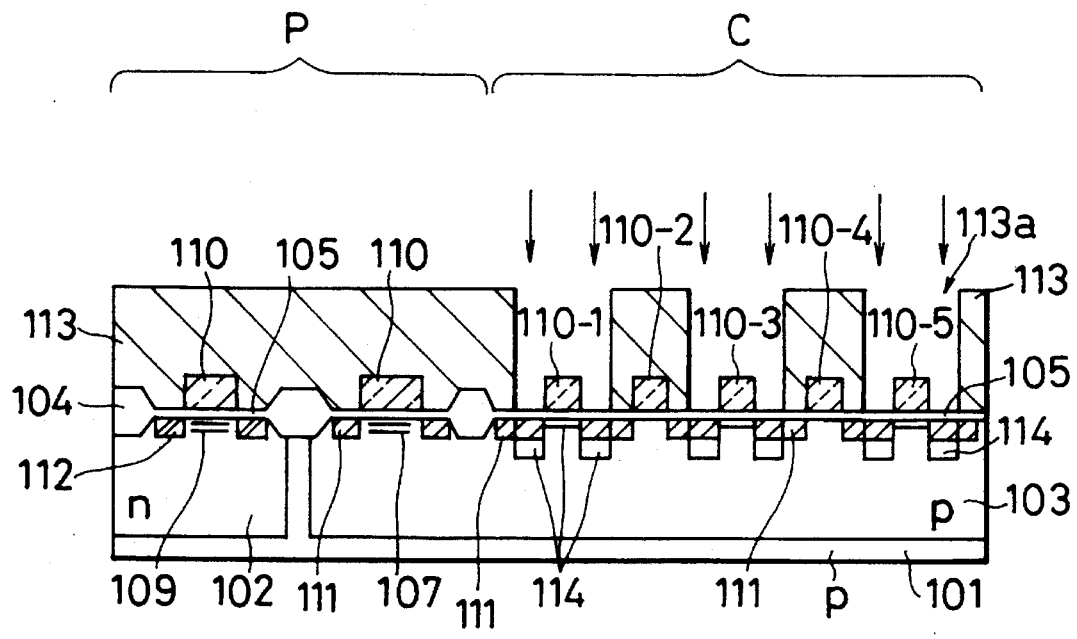
Figure 1E:
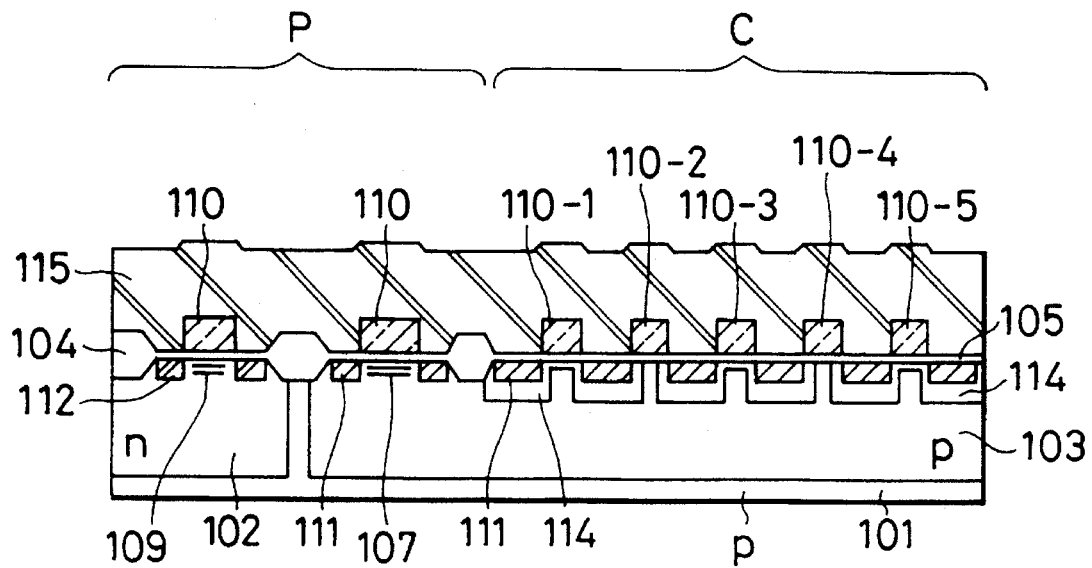
Figure 2:
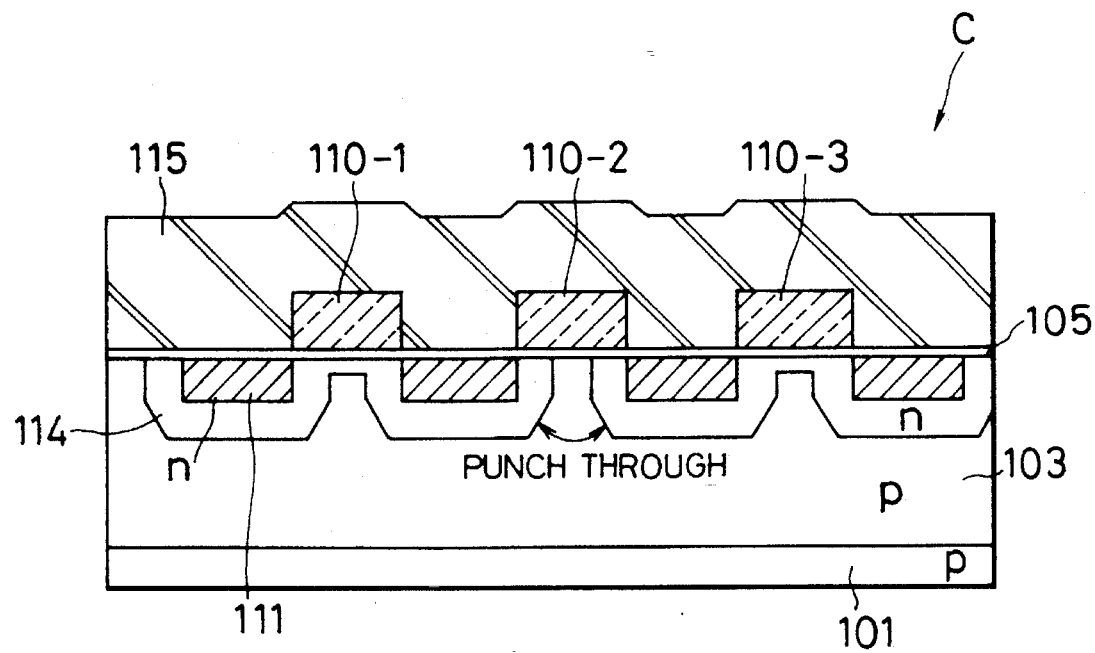
FIG. 2 is a partial cross-section showing the conventional semiconductor memory device fabricated through the process steps shown in FIGS. 1A to 1E.

Though the photoresist film 113 is removed in the conventional method as shown in FIGS. 1D and 1E, the photoresist film 9 is not removed in the first embodiment.

Figure 3C:
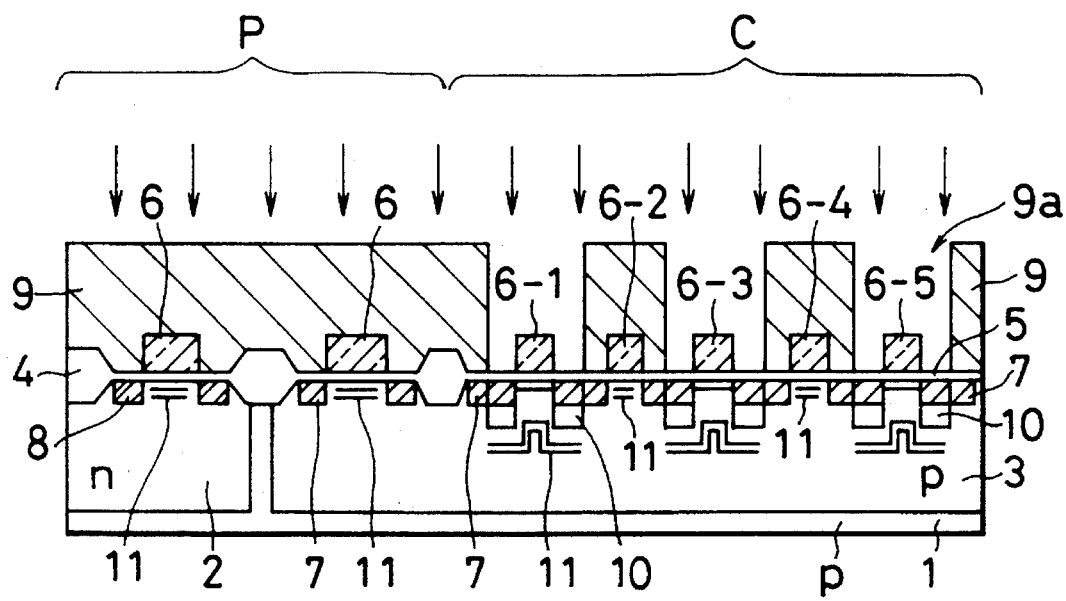

Next, using the same photoresist film 9 patterned as a mask, p-type implantation regions 11 are formed in the n- and p-type wells 2 and 3 in the following way, as shown in FIG. 3C:

Boron ions are irradiated through the photoresist film 9 to be implanted into the active regions for all the MOS transistors in the peripheral circuit area P and in the memory cell area C at an acceleration energy of about 800 keV with a dose of about $1.0 \times 10^{13}$ ions/cm$^2$.

Since the acceleration energy is set as about 800 keV, the irradiated boron ions can pass through the photoresist film 9, the gate electrodes 6, 6-2 and 6-4, and the gate oxide film 5 to go into the corresponding active regions of the substrate 1, respectively. As a result, for the uncoded or unwritten memory cells, the p-type implantation regions 11 are selectively formed in the channel areas under the gate electrodes 6, 6-2 and 6-4, respectively.

Here, the total thickness of the photoresist film 9, each of the gate electrodes 6, 6-2 and 6-4, and the gate oxide film 5 is about 1.4 μm; however, the boron ions can go into the substrate 1 to form the p-type implantation regions 11 in the respective channel areas.

On the other hand, for the coded or written memory cells, since the photoresist film 9 does not exist thereon, the boron ions irradiated pass through the gate electrodes 6-1, 6-3 and 6-5, and the gate oxide film 5 to go into the corresponding active regions of the substrate 1, respectively. Accordingly, the p-type implantation regions 11 are formed at deeper positions from the surface of the substrate 1 than the case of the uncoded or unwritten memory cells, as shown in FIG. 3C.

The p-type implantation regions 11 are formed apart enough from the surface of the substrate 1 in the memory cell area M, these regions 11 do not affect the operational characteristics of the coded MOS transistors or cells.

The p-type implantation regions 11 formed in the channel areas in the peripheral circuit area P are effective for threshold adjustment thereof.

The p-type implantation regions 11 may be formed by ion-implantation of boron at an acceleration energy of 800 to 900 keV with a dose of 1.0 to $2.0 \times 10^{13}$ ions/cm$^2$. The acceleration energy of 800 to 900 keV and the dose of 1.0 to $2.0 \times 10^{13}$ ions/cm$^2$ are selected so that the ions irradiated can pass through the photoresist film 9, the gate electrodes 6, 6-2 and 6-4, and the gate oxide film 5 to form the corresponding implantation regions 11 under the respective gate electrodes 6, 6-2 and 6-4 with given depths. The dose of 1.0 to $2.0 \times 10^{13}$ ions/cm$^2$ is also selected to prevent the punch-through phenomenon effectively in the uncoded memory cells.

Subsequently, after removing the photoresist film 9, an interlayer insulator film 12 is formed to cover the memory cell area C and the peripheral circuit area P by Chemical Vapor deposition (CVD). Then, the interlayer insulator film 12 is subjected to heat-treatment to be reflown. This reflow process is carried out in a nitrogen (N) atmosphere at 900° C. for about 30 minutes.

During this heat-treatment process, the n-type dopant atoms, or phosphorus atoms, doped into the n-type implantation regions 10 diffuse vertically and laterally in the p-type well 3, so that the implantation regions 10 expand to the adjacent channel areas of the uncoded MOS transistors or cells. As a result, the punch-through phenomenon tends to occur.

Figure 3D:
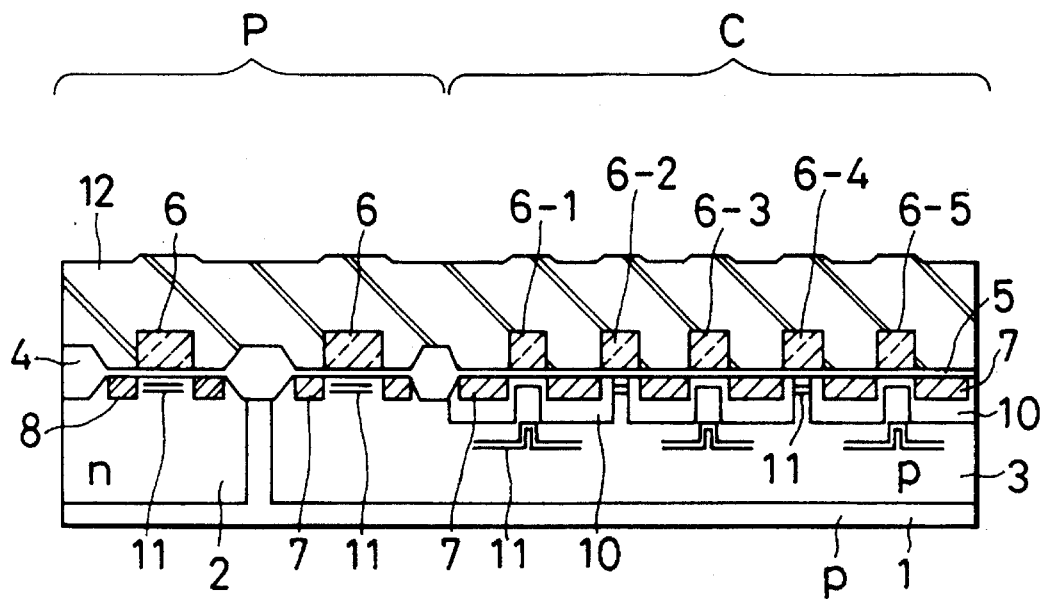

However, as shown in FIG. 3D, since the p-type implantation regions 11 are formed in the channel areas of the uncoded MOS transistors, the regions 11 effectively prevent the adjacent n-type implantation regions 10 from communicating or linking with each other, respectively. As a result, there is no possibility that the uncoded or unwritten memory cells become equivalent to the coded or written memory cells due to the punch-through phenomenon. This means that the contents or program of the ROM device are ensured not to be destroyed during this heat-treatment process.

As described above, with the fabrication method of the first embodiment, since the p-type implantation regions 11 are formed in the channel areas of the uncoded MOS transistors, the punch-through phenomenon is ensured to be prevented between the coded or written memory cells, resulting in the correct data reading.

In addition, since the implantation regions 10 and 11 are formed using the same patterned photoresist 9, the number of the process steps for forming the regions 10 and 11 decrease. Therefore, a shorter Turn Around Time (TAT) of the semiconductor memory device than the conventional ones can be obtained.

In the first embodiment, the punch-through phenomenon is effectively prevented, so that the width of each gate electrode can be reduced. This means that the MOS transistors or memory cells can be integrated on larger scale than the conventional ones.

Figure 4:
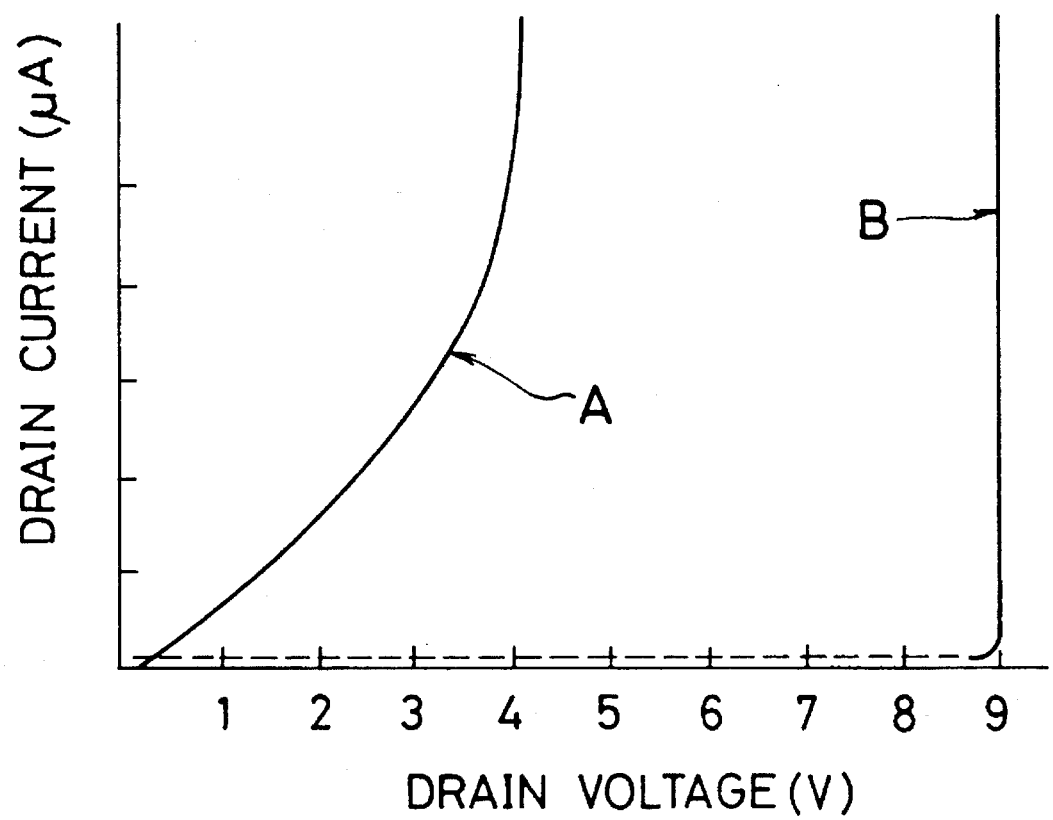
FIG. 4 is a graph showing the relationship between the drain voltage and the drain current of the semiconductor memory device fabricated through the process steps shown in FIGS. 3A to 3D.

FIG. 4 shows a relationship between the drain voltage (V) and the drain current (μA) of one of the uncoded MOS transistors, where the gate voltage is kept at 0 (V). The curve A shows the case without the p-type implantation region 11. The curve B shows the case with the p-type implantation region 11 according to the first embodiment.

In the case without the region 11, it is seen from the curve A that the source-drain withstand voltage increases monotonously with the drain voltage, and is equal to the punch-through withstand voltage.

On the other hand, in the case with the region 11, it is seen from the curve B that the source-drain withstand voltage is kept substantially zero and suddenly increases at near a 9–V drain voltage. This means that the source-drain withstand voltage is equal to the breakdown voltage of the p-n junction, which is very higher than the punch-through withstand voltage, and that the punch-through phenomenon is extremely difficult to occur.

SECOND EMBODIMENT

Figure 5A:
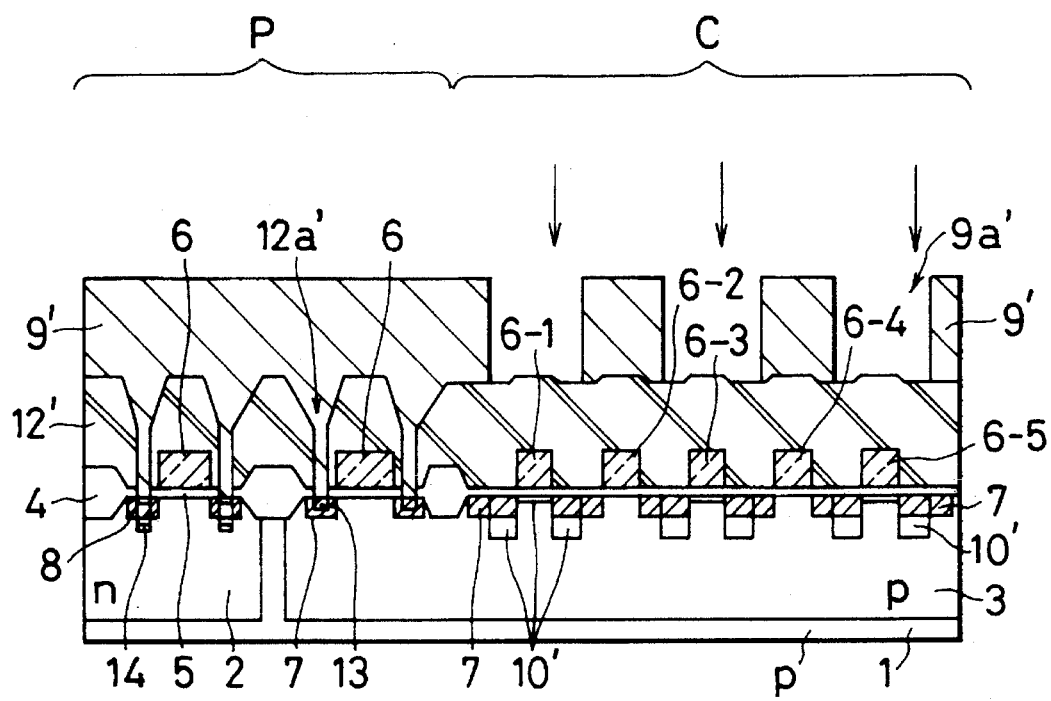
FIGS. 5A and 5B are partial cross-sections showing a fabrication method of a semiconductor memory device according to a second embodiment of the present invention, respectively.
Figure 5B:
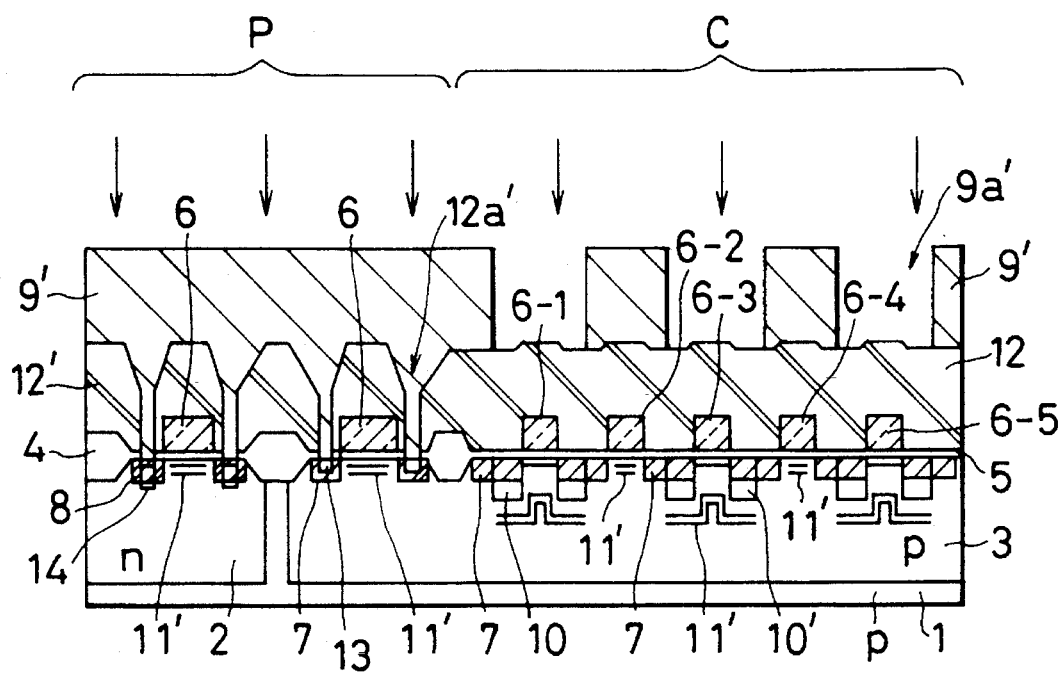

FIGS. 5A and 5B show a fabrication method of a NAND-type mask ROM device according to a second embodiment.

By the same process steps as those of the first embodiment, the n- and p-channel MOS transistors are formed in the peripheral circuit area P of the substrate 1, and the n-channel MOS transistors are formed in the memory cell area C thereof, as shown in FIG. 5A.

The gate electrodes 6, 6-1, 6-2, 6-3, 6-4 and 6-5 are formed on the gate oxide film 5 of the corresponding memory cells. The n-type source/drain regions 7 are formed in the p-type well 3 for the n-channel MOS transistors in both the peripheral circuit area P and those in the memory cell area C. The p-type source/drain regions 8 are formed in the n-type well 2 for the p-channel MOS transistors in the peripheral circuit area P.

The data-writing or coding process steps for the substrate 1 are as follows:

As shown in FIG. 5A, an interlayer insulator film 12' with a thickness of about 8000 Å is deposited on the substrate 1 to cover the memory cell area C and the peripheral circuit area P by CVD, and is reflown in a nitride atmosphere at 900° C. for about 30 minutes. Then, the interlayer insulator film 12' is patterned to have contact holes 12a'. The contact holes 12a' are used for interconnection between the source/drain regions 7 and 8 of the memory cells in the peripheral circuit area P and a wiring conductive film to be formed on the interlayer insulator film 12'.

Here, the contact holes 12a' are positioned over the source/drain regions 7 and 8 of the MOS transistors with the gate electrodes 6 in the peripheral circuit area P, respectively.

After forming a patterned photoresist film (not shown) on the interlayer insulator film 12', using the patterned photoresist film and the patterned interlayer insulator film 12' as a mask, n-type dopant ions are selectively implanted into the source/drain regions 7 in the p-type well 3 in the peripheral circuit area P. Thus, n-type contact regions 13 are formed in the p-type well 3, as shown in FIG. 5A.

The n-type contact regions 13 may be formed by ion-implantation of phosphorus at an acceleration energy of 50 to 100 keV with a dose of 1.0 to $5.0\times10^{15}$ ions/cm$^2$.

The n-type contact regions 13 thus formed are shallower than the source/drain regions 7. The patterned photoresist film is then removed.

Similarly, after forming another patterned photoresist film (not shown) on the interlayer insulator film 12', using the patterned photoresist film and the patterned interlayer insulator film 12' as a mask, p-type dopant ions are selectively implanted into the source/drain regions 8 in the n-type well 2 in the peripheral circuit area P. Thus, p-type contact regions 14 are formed in the n-type well 2, as shown in FIG. 5A.

The p-type contact regions 14 may be formed by ion-implantation of boron at an acceleration energy of 50 to 100 keV with a dose of 1.0 to $5.0\times10^{15}$ ions/cm$^2$.

The p-type contact regions 14 thus formed are deeper than the source/drain regions 8. The patterned photoresist film is then removed.

Next, as shown in FIG. 5A, a photoresist film 9' is formed on the interlayer insulator film 12' to cover the memory cell area C and the peripheral circuit area P, and is patterned to have windows 9a'. The windows 9a' are placed at positions corresponding to the MOS transistors or cells to be coded in the memory cell area C.

Here, the windows 9a' are positioned over the MOS transistors with the gate electrodes 6-1, 6-3 and 6-5, respectively.

Using the patterned photoresist film 9' as a mask, phosphorus (P) ions are selectively implanted into the active regions for the n-channel MOS transistors in the memory cell area C at an acceleration energy of about 1 MeV with a dose of about $5.0\times10^{13}$ ions/cm$^2$. Thus, n-type coding implantation regions 10' are formed in the p-type well 3, as shown in FIG. 5A.

Since the acceleration energy is set as about 1 MeV, the irradiated phosphorus ions can pass through the interlayer insulator film 12', the gate electrodes 6-1, 6-3 and 6-5, and the gate oxide film 5 to go into the corresponding active regions of the substrate 1, respectively. As a result, for the coded or written memory cells, the n-type implantation regions 10' are selectively formed in the channel areas under the gate electrodes 6-1, 6-3 and 6-5, respectively, as shown in FIG. 5A.

Pairs of the n-type implantation regions 10' are formed in self align to the corresponding gate electrodes 6-1, 6-3 and 6-5, respectively. As shown in FIG. 5A, each pair of the regions 10' are communicated with each other under the corresponding gate electrodes 6-1, 6-3 and 6-5. The regions 10' are provided deeper than the source/drain regions 7 in the substrate 1.

Here, the total thickness of the interlayer insulator film 12', each of the gate electrodes 6-1, 6-3 and 6-5, and the gate oxide film 5 is about 1.0 μm; however, the phosphorus ions can go into the substrate 1 to provide the n-type implantation regions 10' in the respective channel areas.

The n-type implantation regions 10' may be formed by ion-implantation of phosphorus at an acceleration energy of 1.0 to 1.1 MeV with a dose of 1.0 to $5.0\times10^{13}$ ions/cm$^2$. The acceleration energy of 1.0 to 1.1 MeV and the dose of 1.0 to $5.0\times10^{13}$ ions/cm$^2$ are selected so that the ions irradiated can pass through the interlayer insulator film 12', the gate electrodes 6-1, 6-3 and 6-5, and the gate oxide film 5 to form the corresponding implantation regions 10 under the respective gate electrodes 6-1, 6-3 and 6-5 with given depths.

Similar to the first embodiment, the photoresist film 9' is not removed here.

Next, using the same photoresist film 9' patterned as a mask, p-type implantation regions 11' for the threshold adjustment are formed in the n- and p-type wells 2 and 3, as shown in FIG. 5B in the following way:

Boron ions are irradiated through the photoresist film 9' to be implanted into the active regions for all the MOS transistors or memory cells in the peripheral circuit area P and in the memory cell area C at an acceleration energy of about 2 MeV with a dose of about $1.0\times10^{13}$ ions/cm$^2$.

Since the acceleration energy is set as about 2 MeV, for the MOS transistors in the peripheral circuit area P, the boron ions irradiated can pass through the photoresist film 9', the interlayer insulator film 12', the gate electrodes 6, and the gate oxide film 5 to go into the corresponding source/drain regions 8, respectively. As a result, the p-type implantation regions 11' are formed in the channel areas under the gate electrodes 6, respectively.

Part of the boron ions passing through the contact holes 12a' of the interlayer insulator film 12' go into the p-type contact regions 14 and the n-type contact regions 13, respectively.

For the uncoded MOS transistors in the memory cell area C, the boron ions irradiated can pass through the photoresist film 9', the interlayer insulator film 12', the gate electrodes 6-2 and 6-4, and the gate oxide film 5 to go into the corresponding source/drain regions 7, respectively. As a result, the p-type implantation regions 11' are formed in the channel areas under the gate electrodes 6-2 and 6-4, respectively.

On the other hand, for the coded or written memory cells in the memory cell area C, since the photoresist film 9' does not exist thereon, the boron ions irradiated pass through the interlayer insulator film 12', the gate electrodes 6-1, 6-3 and 6-5, and the gate oxide film 5 to go into the corresponding source/drain regions 7, respectively. Accordingly, the p-type implantation regions 11' are formed at deeper positions from the surface of the substrate 1 than the case of the uncoded or unwritten memory cells, as shown in FIG. 5B.

The p-type implantation regions 11' formed at the deeper positions in the memory cell area C do not affect the operational characteristics of the coded MOS transistors or cells. The p-type implantation regions 11' formed in the channel areas in the peripheral circuit area P and the memory cell area C are effective for threshold adjustment.

The p-type implantation regions 11' may be formed by ion-implantation of boron at an acceleration energy of 2.0 to 2.1 MeV with a dose of 1.0 to $5.0\times10^{13}$ ions/cm$^2$. The acceleration energy of 2.0 to 2.1 MeV and the dose of 1.0 to $5.0\times10^{13}$ ions/cm$^2$ are selected so that the ions irradiated can pass through the photoresist film 9', the gate electrodes 6, 6-2 and 6-4, and the gate oxide film 5 to form the corresponding implantation regions 11' under the respective gate electrodes 6, 6-2 and 6-4 with given depths. The dose of 1.0 to $5.0\times10^{13}$ ions/cm$^2$ is also selected to prevent the punch-through phenomenon effectively in the uncoded memory cells.

Subsequently, the photoresist film 9' is removed, and a conductive film (not shown) for wiring is formed on the interlayer insulator film 12'. The conductive film is electrically interconnected with the contact regions 13 and 14, respectively through the corresponding contact holes 12a' of the interlayer insulator film 12'.

Since no heat-treatment process is required for the interlayer insulator film 12' after forming the n- and p-type implantation regions 10' and 11', there is no possibility that the diffusion of the dopant ions implanted into the substrate 1 due to heat as shown in the first embodiment. This means that the punch-through phenomenon is more difficult to occur than the first embodiment.

Therefore, in the second embodiment, there is no possibility that the uncoded or unwritten memory cells become equivalent to the coded or written memory cells due to the punch-through phenomenon, sop that the contents of the ROM device are ensured not to be destroyed.

Since the implantation regions 10' and 11' are formed using the same photoresist 9' patterned, the number of the process steps for forming the regions 10' and 11' decrease, enabling a shorter TAT than the conventional ones.

In the second embodiment, similar to the first embodiment, the width of each gate electrode can be reduced, so that the MOS transistors or memory cells can be integrated on larger scale than the conventional ones.

Also, since the n- and p-type contact regions 13 and 14 are provided, the following advantage can be obtained: In the case that the contact holes 12a' of the interlayer insulator film 12' are formed to be shifted from the given, correct positions during the process step of patterning the interlayer insulator film 12', each of the contact holes 12a' thus formed may be possibly positioned outside of corresponding one of the source/drain regions 7 and 8, partially. However, due to the n- and p-type contact regions 13 and 14, the obtainable contact holes 12a' can be opposed to either corresponding one of the source/drain regions 7 and 8 or corresponding one of the contact regions 13 and 14. Therefore, it is difficult to arise a problem about contacts for the source/drain regions 7 and 8.

In the above first and second embodiments, NAND type ROM devices are described; however, the present invention may be applied to any other types of the semiconductor memory devices than the NAND type ROM, for example an OR type one.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. A fabrication method of a semiconductor memory device, said method comprising the steps of:

(a) preparing memory cells formed of first MOS transistors and peripheral circuits formed of second MOS transistors on a semiconductor substrate of a first conductivity type, said memory cells being formed in a memory cell area of said substrate, said peripheral circuits being formed in a peripheral circuit area of said substrate;

(b) forming a photoresist film on said substrate to cover said memory cell area and said peripheral circuit area;

(c) patterning said photoresist film to have windows so that selected ones of said first transistors to be coded are exposed from said photoresist film through said windows, respectively;

(d) selectively doping a first dopant of a second conductivity type for coding into said selected ones of said first transistors using said patterned photoresist film as a mask, so that first impurity-doped regions of said second conductivity type being formed in channel areas of said selected ones of said first transistors, respectively, said second conductivity type being opposite in polarity to said first conductivity type; and (e) doping a second dopant of said first conductivity type for threshold adjustment into said first transistors and said second transistors through said patterned photoresist film, so that second impurity-doped regions of said first conductivity type being formed in channel areas of unselected ones of said first transistors and said second transistors, respectively;

wherein during said step of (e), said second dopant doped through said selected ones of said first transistors forms third impurity-doped regions of said first conductivity type apart from said channel areas of said selected ones of said first transistors in said substrate, respectively;

and wherein said third impurity-doped regions serve to restrain said first dopant doped into said selected ones of said first transistors in said step of (d) from laterally diffusing in said substrate.

2. The method as claimed in claim 1, wherein said step (d) of selectively doping said first dopant for coding and said step (e) of doping said second dopant for threshold adjustment are carried out by ion-implantation.

3. The method as claimed in claim 2, wherein first and second transistors have gate electrodes and a gate insulator film, an acceleration energy for carrying out said step (d) of selectively doping said first dopant for coding is set so that said first dopant can pass through said gate electrodes and said gate insulator film of said selected ones of said first transistors into said substrate, respectively;

said acceleration energy being set so that said first dopant cannot pass through said patterned photoresist film, said gate electrodes and gate insulator film of said unselected ones of said first transistors and said second transistors into said substrate, respectively.

4. The method as claimed in claim 2, wherein first transistors and second transistors have gate electrodes and a gate insulator film, an acceleration energy for carrying out said step (e) of doping said second dopant for threshold adjustment is set so that said second dopant can pass through said patterned photoresist film, said gate electrodes and said gate insulator film of said unselected ones of said first transistors and said second transistors into said substrate, respectively;

said acceleration energy being set so that said third impurity-doped regions are placed in said substrate apart enough from said first impurity-doped regions not to affect operations of said selected ones of said first transistors, respectively.

5. The method as claimed in claim 1, further comprising steps of (f), (g) and (h), said steps of (f), (g) and (h) being carried out after said step (d) of selectively doping said first dopant and said step (e) of doping said second dopant;

wherein in said step of (f), said patterned photoresist film is removed from said substrate;

in said step of (g), an interlayer insulator film is formed on said substrate to cover said memory cell area and said peripheral circuit area; and in said step of (h), said interlayer insulator film is subjected to heat for reflowing said interlayer insulator film.

6. The method as claimed in claim 2, wherein said step (d) of doping said first dopant for coding is carried out by implanting phosphorus ions into said selected ones of said first transistors at an acceleration energy of 300 to 400 keV with a dose of 1.0 to 5.0×10$^{13}$ ions/cm$^2$.

7. The method as claimed in claim 2, wherein said step (e) of doping said second dopant for threshold adjustment is carried out by implanting boron ions into said first transistors and said second transistors at an acceleration energy of 800 to 900 keV with a dose of 1.0 to 2.0×10$^{13}$ ions/cm$^2$.

8. The method as claimed in claim 2, wherein said step (d) of doping said first dopant for coding is carried out by implanting phosphorus ions into said selected ones of said first transistors at an acceleration energy of 300 to 400 keV with a dose of 1.0 to 5.0×10$^{13}$ ions/cm$^2$; and wherein said step (e) of doping said second dopant for threshold adjustment is carried out by implanting boron ions into said first transistors and said second transistors at an acceleration energy of 800 to 900 keV with a dose of 1.0 to 2.0×10$^{13}$ ions/cm$^2$.

9. A fabrication method of a semiconductor memory device, said method comprising the steps of:

(a) preparing memory cells formed of first MOS transistors and peripheral circuits formed of second MOS transistors on a semiconductor substrate of a first conductivity type, said memory cells being formed in a memory cell area of said substrate, said peripheral circuits being formed in a peripheral circuit area of said substrate;

(b) forming an interlayer insulator film on said substrate to cover said memory cell area and said peripheral circuit area;

(c) heating said interlayer insulator film for reflowing said interlayer insulator film;

(d) forming a photoresist film on said interlayer insulator film thus reflown to cover said memory cell area and said peripheral circuit area;

(e) patterning said photoresist film to have windows so that said windows are placed over selected ones of said first transistors to be coded, respectively;

(f) selectively doping a first dopant of a second conductivity type for coding into said selected ones of said first transistors through said interlayer insulator film using said patterned photoresist film as a mask, so that first impurity-doped regions of said second conductivity type being formed in channel areas of said selected ones of said first transistors, respectively, said second conductivity type being opposite in polarity to said first conductivity type; and (g) doping a second dopant of said first conductivity type for threshold adjustment into said first transistors and said second transistors through said patterned photoresist film and said interlayer insulator film, so that second impurity-doped regions of said first conductivity type being formed in channel areas of unselected ones of said first transistors and said second transistors, respectively;

wherein during said step of (g), said second dopant doped through said selected ones of said first transistors forms third impurity-doped regions of said first conductivity type apart from said channel areas of said selected ones of said first transistors in said substrate, respectively;

and wherein said third impurity-doped regions serve to restrain said first dopant doped into said selected ones of said first transistors in said step of (f) from laterally diffusing in said substrate.

10. The method as claimed in claim 9, wherein said step (f) of selectively doping said first dopant for coding and said step (g) of doping said second dopant for threshold adjustment are carried out by ion-implantation.

11. The method as claimed in claim 10, wherein first transistors and second transistors have gate electrodes and a gate insulator film, an acceleration energy for carrying out said step (f) of selectively doping said first dopant for coding is set so that said first dopant can pass through said interlayer insulator film, said gate electrodes and said gate insulator film of said selected ones of said first transistors into said substrate, respectively;

said acceleration energy being set so that said first dopant cannot pass through said interlayer insulator film, said patterned photoresist film, said gate electrodes and said gate insulator film of said unselected ones of said first transistors and said second transistors into said substrate, respectively.

12. The method as claimed in claim 10, wherein first transistors and second transistors have gate electrodes and a gate insulator film, an acceleration energy for carrying out said step (g) of doping said second dopant for threshold adjustment is set so that said second dopant can pass through said interlayer insulator film, said patterned photoresist film, said gate electrodes and said gate insulator film of said unselected ones of said first transistors and said second transistors into said substrate, respectively;

said acceleration energy being set so that said third impurity-doped regions are placed in said substrate apart enough from said first impurity-doped regions not to affect operations of said selected ones of said first transistors, respectively.

13. The method as claimed in claim 9, further comprising steps of (h) and (i), said steps of (h) and (i) being carried out between said step (b) of forming said interlayer insulator film and said step (c) of heating said interlayer insulator film for reflowing;

wherein in said step of (h), contact holes are formed in said interlayer insulator film; and in said step of (i), contact regions are formed in said substrate at positions corresponding to said contact holes, said contact regions being electrically interconnected through said corresponding contact holes with a conductive film to be formed on said interlayer insulator film.

14. The method as claimed in claim 10, wherein said step (f) of doping said first dopant for coding is carried out by implanting phosphorus ions into said selected ones of said first transistors at an acceleration energy of 1.0 to 1.1 MeV with a dose of 1.0 to $5.0 \times 10^{13}$ ions/cm$^2$.

15. The method as claimed in claim 10, wherein said step (g) of doping said second dopant for threshold adjustment is carried out by implanting boron ions into said first transistors and said second transistors at an acceleration energy of 2.0 to 2.1 MeV with a dose of 1.0 to $5.0 \times 10^{13}$ ions/cm$^2$.

16. The method as claimed in claim 10, wherein said step (f) of doping said first dopant for coding is carried out by implanting phosphorus ions into said selected ones of said first transistors at an acceleration energy of 1.0 to 1.1 MeV with a dose of 1.0 to $5.0 \times 10^{13}$ ions/cm$^2$; and wherein said step (g) of doping said second dopant for threshold adjustment is carried out by implanting boron ions into said first transistors and said second transistors at an acceleration energy of 2.0 to 2.1 MeV with a dose of 1.0 to $5.0 \times 10^{13}$ ions/cm$^2$.

\* \* \* \* \*